United States Patent [19]

Ngo et al.

[11] Patent Number: 4,646,203
[45] Date of Patent: Feb. 24, 1987

[54] MOUNTING STRUCTURE FOR SEMICONDUCTOR DEVICES

[75] Inventors: Dat V. Ngo, Allentown; Elliot G. Jacoby, Glenside, both of Pa.

[73] Assignee: Lutron Electronics Co., Inc., Coopersburg, Pa.

[21] Appl. No.: 698,770

[22] Filed: Feb. 6, 1985

[51] Int. Cl.⁴ ............................................. H05K 7/20
[52] U.S. Cl. ................................. 361/388; 165/185; 174/16 HS; 357/81; 361/386
[58] Field of Search ............................. 165/80.3, 185; 174/16 HS; 357/79, 81; 361/386, 387, 388, 400, 405, 417, 419, 420

[56] References Cited

U.S. PATENT DOCUMENTS 3,611,046 10/1971 Covert .............................. 165/185
3,801,874 4/1974 Stefani ........................... 174/16 HS

FOREIGN PATENT DOCUMENTS 659585 3/1963 Canada ........................... 176/16 HS Primary Examiner—A. D. Pellinen
Assistant Examiner—Gregory D. Thompson
Attorney, Agent, or Firm—Ostrolenk, Faber, Gerb & Soffen

[57] ABSTRACT

A mounting structure is disclosed for mounting a semiconductor device on a conductive heat sink while electrically insulating the two. A thin, flat thermally conductive electrically insulative sheet is disposed between a flat electrically conductive surface of the semiconductor device and the flat electrically conductive surface of the heat sink which is to receive the semiconductor device. The semiconductor device is fixed to the insulation sheet by a first electrically conductive rivet which compresses the two together. The opening in the insulation sheet through which the rivet passes is enlarged so that no radial forces are applied to the sheet by expansion of the rivet. The rivet head on the bottom of the insulation sheet extends into an enlarged opening in the underlying heat sink but does not touch the opening. The insulation sheet is connected to the heat sink by a second conductive rivet which is laterally displaced from the first, and applies compressive forces between the insulation sheet and heat sink. The opening in the insulation sheet receiving the second rivet is also enlarged so that radial forces cannot be applied from the rivet to the insulation sheet. The insulation sheet is sufficiently rigid so as to hold the full surface of the semiconductor device against the full adjacent surface of the sheet, and to hold the opposite surface of the sheet against the heat sink. The invention is used for mounting of various semiconductor device package styles including the TO-220 outline and the stud mounted outline package.

21 Claims, 3 Drawing Figures

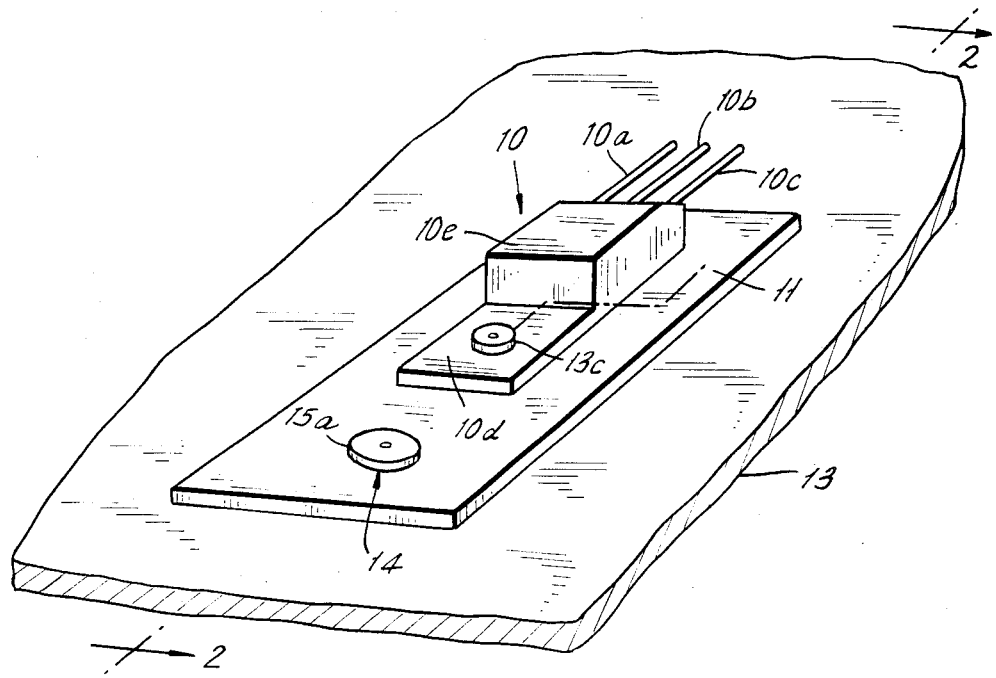
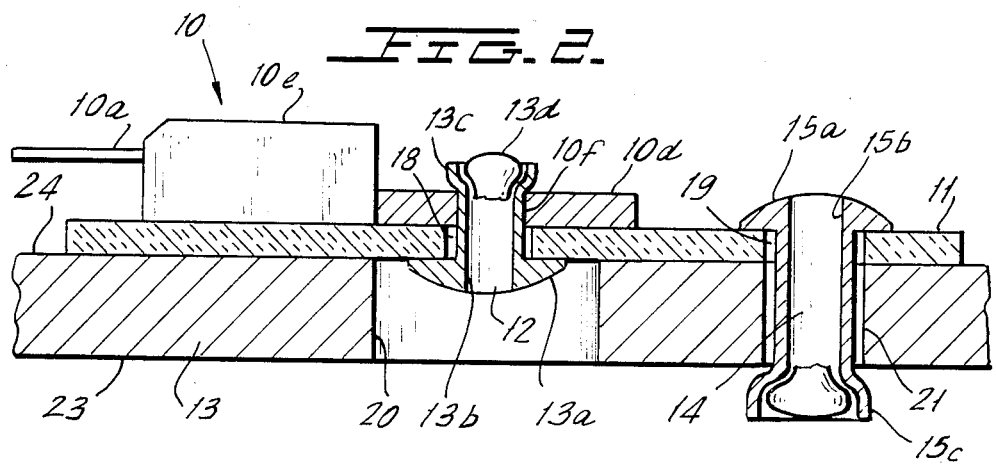

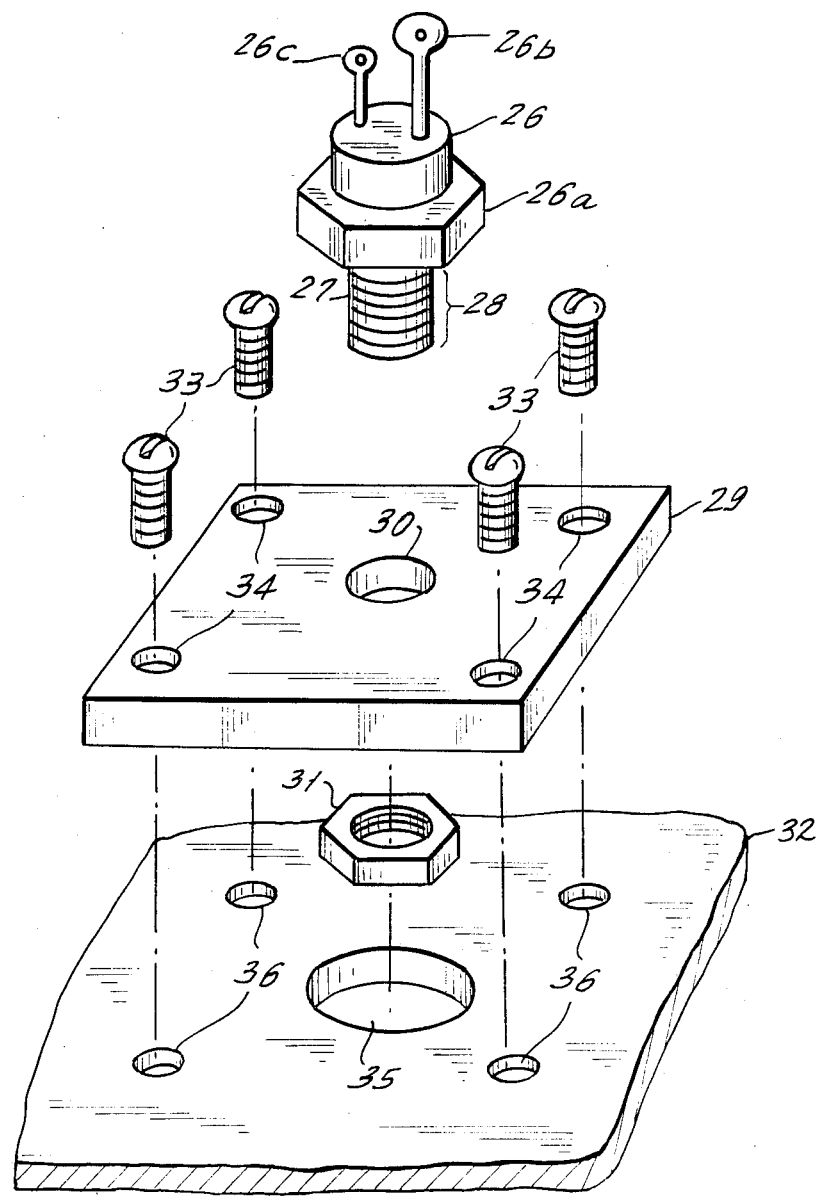

MOUNTING STRUCTURE FOR SEMICONDUCTOR DEVICES

BACKGROUND OF THE INVENTION

This invention relates to a novel mounting structure for mounting power semiconductor devices such as triacs or silicon controlled rectifiers, and more specifically relates to a novel insulation mounting structure which enables the mounting of the semiconductor device so that it is thermally coupled to an underlying heat sink but is electrically insulated therefrom.

Power semiconductor devices have numerous applications. By way of example, they can be used in wall box dimmers of the type shown in U.S. Pat. Nos. 3,746,923 and 3,801,874.

The mounting of such semiconductor power devices requires a relatively large heat sink to which the device is coupled so that the device can be properly cooled. It is also usually necessary that the semiconductor device be electrically insulated from the electrically conductive heat sink to avoid the danger of shock to a user who might come in contact with the heat sink. The mounting structure should also be of a nature to be easily manufactured and should have sufficient strength to allow handling of the semiconductor device as when attaching leads to the device terminal without causing mechanical damage.

Some semiconductor devices are manufactured with a semiconductor die contained within the device which is electrically insulated from its conductive outer surface. Such isolated devices can then be mechanically connected to the heat sink by any appropriate fastener, such as a screw or rivet. Thus, the device is inherently electrically insulated from the heat sink. These devices, however, are more costly than devices which do not have internal isolation and generally have poorer heat transfer characteristics than unisolated devices.

Another known method for mounting semiconductor devices employs a metalized ceramic disk which is first soldered to the device and then soldered to a subplate of conductive material which is fastened to the heat sink. The metalizing process and soldering process are costly and such devices tend to be sensitive to the heat of soldering. Additional thermal interfaces are also introduced.

It is also known to secure semiconductor devices to their heat sink by means of an epoxy cement, using a thin, electrically insulative cement layer. This process requires great care during the manufacturing process and a high degree of cleanliness for proper mechanical adhesion. Moreover, the adhesives are relevantly poor thermal conductors.

It is also known to provide mechanical clamps which will press the semiconductor device against a thin insulation layer inserted between the device and the heat sink. These clamps require a large area and are usually metallic so that they too must be electrically isolated from the device or from the heat sink.

Other connecting systems are known using mica disks with nylon shoulder washers and screws but these are ineffective because the mica is a poor heat conductor and the nylon shoulder washers will flow under pressure, thus reducing clamping force and heat transfer. An arrangement similar to this is disclosed in U.S. Pat. No. 3,801,874 in which a thin insulation sheet is disposed between a TO-220 outline semiconductor device and the heat sink. The opening in the mounting tab of the TO-220 device is aligned with an opening in the insulation sheet and an opening in the heat sink and a single conductive screw in employed to compress the three components together. An electrically insulative shoulder washer is required to ensure electrical insulation between the conductive screw and the conductive tab of the semiconductor package. A deformable insulation collar fills in the remaining air gaps in the mounting structure. Thus, a large number of separate parts is needed.

SUMMARY OF THE INVENTION

In accordance with the present invention, a thin, preferably heat conductive, electrically insulative, rigid sheet is interposed between the flat conductive surface of a power semiconductor device and an electrically conductive heat sink. Two laterally conductive mechanical fasteners are then employed, one fastening the insulation sheet to the semiconductor device in extended surface to surface contact, and the other connecting only the insulation sheet to the heat sink. The insulation sheet is sufficiently rigid to hold itself, in cantilever, against the heat sink.

The portion of the first rivet which extends beyond the insulation sheet in its function of connecting the insulation sheet to the semiconductor device, is received in an enlarged opening in the heat sink so that this metallic fastener is not electrically connected to the heat sink. Pop rivets are preferably used for the connecting members, although any type of conventional fastener can be used. The openings in the insulation ceramic plate, which receive the conductive fastener, preferably are oversized so that radial forces cannot be transmitted from the fastener to the opening which would apply a shear stress to the plate. The plate can be made of relatively thin ceramic material to enhance heat transfer. The ceramic may be fabricated by punching or molding in its green state and before firing. The preformed openings permit repeatable, automatic location of the semiconductor when it is attached first to the insulation plate and then to the heat sink.

The novel use of a single insulation sheet for insulating the semiconductor device from the heat sink minimizes the number of thermal interfaces and is a significant feature of the invention. While the invention requires two fasteners, such as rivets or eyelets, the mounting cost is reduced, since these are inexpensive, commercially available parts. In operation, constant clamping forces are maintained over an extended range of temperature for a long operating life.

BRIEF DESCRIPTION OF THE DRAWINGS

FIG. 1 is a perspective view of a TO-220 style power semiconductor device which is mounted on an underlying heat sink in accordance with the invention.

FIG. 2 is a cross-sectional view of FIG. 1 taken across the section line 2—2 in FIG. 1.

FIG. 3 is a exploded perspective view of a second embodiment of the invention as applied to the mounting of a stud mounted power semiconductor device.

DETAILED DESCRIPTION OF THE DRAWINGS

Referring first to FIG. 1, there is shown therein a mounting structure for power semiconductor device 10 which has a TO-220 case style of well-known variety. Semiconductor device 10 typically may have two power leads 10a and 10b and a control electrode lead 10c, as shown in FIG. 1. Each of these leads are electrically insulated from a thermally and electrically conductive tab 10d which extends from the plastic encapsulation housing portion 10e of the device. A semiconductor die (not shown) will be encapsulated within housing 10e and is electrically connected to the terminals 10a, 10b, 10c and to the conductive tab 10d. Tab 10d conventionally has a central mounting opening 10f extending therethrough (FIG. 2). A single ceramic insulation sheet 11 is provided, which may be of alumina, having a thickness of 0.040 inch and a width of 0.540 inch and length of 1.250 inches. It will be apparent that other plate sizes and thickness can be used, as desired, by the designer. Alumina plate 11 is characterized as having good electrical insulation qualities and good thermal conductive qualities. Other materials could have been used, having similar properties.

Plate 11 contains two enlarged diameter openings 18 and 19 (FIG. 1). By way of example, these openings may have diameters of 0.102 inch each. The openings can be formed in the ceramic material by machining or can be formed while the plate is green and before firing.

A heat sink 13 is also provided. Typically, in the case of a wall box dimmer, heat sink 13 is the conductive plate of the dimmer which carries the components as disclosed in U.S. Pat. No. 3,746,923. Plate 13 is preferably of aluminum and may have a thickness of 0.100 inch but can be of other materials of other thicknesses and shape.

In order to properly cool the semiconductor device 10 during its operation, it is necessary that device 10 be firmly fixed to the ceramic sheet 11 and to the thermally and electrically conductive heat sink 13. Heat sink 13 is therefore provided with two through openings 20 and 21 which receive conductive mounting rivets, as will be described. A first fastener 12 is shown in FIGS. 1 and 2 as an expansion rivet having a head 13a of enlarged diameter, a shank portion 13b of smaller diameter, and an enlarged second head 13c which extends above thermally and electrically conductive tab 10d of semiconductor device 10. The rivet 12 may be a commercially available type of metal "pop" rivet in which the shank portion 13b is expanded at its second head 13c by means of an appropriate pop-off mandrel which is shown in place as mandrel 13d in FIG. 2.

The arrangement shown will apply a firm compression force between the ceramic sheet 11 and the conductive tab 10d in order to firmly connect these parts in surface to surface contact. The opening 20 in heat sink 13 is sufficiently large that it does not make electrical contact with any portion of the rivet head 13a. The outer diameter of shank portion 13b is intentionally smaller than the diameter of opening 18. Consequently, it is not possible to transfer radially directed forces, due to the expansion of the diameter of shank portion 13b during the formation of the head 13c. In a typical embodiment of the invention, rivet 12 had a length of 0.212 inch and a shank diameter of 0.094 inch and the head 13a had a diameter of 0.188 inch.

A second fastener 14 such as a rivet is employed to connect the sheet 11 and heat sink 13 in firm surface to surface contact in a manner similar to that described for the rivet 12. Thus, rivet 14 has a head 15a, a shank portion 15b and a head 15c. The head 15c is formed by a rivet mandrel of the pop-off variety discussed previously. Rivet 14 then firmly secures sheet 11 to the heat sink 13. Note that the shank portion 15b has an outer diameter substantially less than the diameter of opening 19 to prevent transmission of shear stresses to the ceramic sheet 11 during the formation of the rivet head 15c.

Before securing together the various parts in the manner illustrated, a conventional conductive grease can be applied between the opposing surfaces to enhance heat transfer from conductive tab 10 to the sheet 11 and from the sheet 11 into the heat sink 13.

If desired, the opening 20 in the heat sink 13 can be filled with pitch, epoxy or silicon rubber or any similar material to fully insulate the electrically live head 13a of the rivet 12. This is particularly necessary if the front surface 23 of heat sink 13 is exposed to contact by an operator or user of the device. The rear surface 24 may be conventionally enclosed by the back cap of a wall box dimmer or the like.

While pop-type rivets are the preferred fasteners and are disclosed in FIGS. 1 and 2, it will be noted that the present invention can be carried out with other types of rivets, eyelets, screws or fasteners whether of conductive material or insulation material.

FIG. 3 shows a second embodiment of the invention wherein the inventive concepts are employed to mount a stud type power semiconductor device rather than the TO-220 type package outline shown in FIGS. 1 and 2. Thus, in FIG. 3, a standard stud mounted type semiconductor device 26 is shown which has a copper flange 26a which has a flat annular surface (not shown) which surrounds an integral copper screw thread 27 which forms a stud 28. The flat annular surface is disposed in a plane parallel to the axis of the stud 28. The semiconductor device 26 may have a cathode terminal 26b and gate terminal 26c. The device anode would be the flange or conductive body 26a where the device is, for example, an SCR.

A thin alumina block 29 is then provided as the electrically insulative but heat conductive member similar to the sheet 11 of FIGS. 1 and 2. The alumina block 29 has an enlarged opening 30 formed centrally therein which is sufficiently large to receive the stud 28 with clearance that avoids contact between the walls of the opening 30 and the stud 28 after installation of the device. A nut 31 is threaded onto the thread 27 in order to secure device 26 to the block 29.

The alumina plate or block 29 is then fixed to a heat sink 32 which may have any desired configuration, except that it has a surface which conforms to the facing surface of the alumina plate 29. Thus, a plurality of openings 34 in the plate 29 receive respective screw fasteners 33 with sufficient clearance to avoid transmitting a stress to the plate. Screws 34 and are threaded into respective threaded openings 36 in the heat sink 32.

A further opening 35 is formed in the heat sink 32 to provide clearance and prevent contact between the heat sink 32 and the nut 31.

Although the present invention has been described in connection with preferred embodiments thereof, many variations and modifications will now become apparent to those skilled in the art. It is preferred, therefore, that the present invention be limited not by the specific disclosure herein, but only by the appended claims.

What is claimed is:

1. A mounting structure for a power semiconductor device in a wall box voltage control device; said semiconductor device having a flat electrically and thermally conductive mounting surface; said flat conductive mounting surface having a first opening extending therethrough with an axis perpendicular to said flat mounting surface; said mounting structure comprising:
  a thin, mechanically rigid insulation sheet which is conextensive with at least a portion of said flat mounting surface;
  a heat sink having a flat surface which is coextensive with at least a portion of said insulation sheet;
  first and second metallic fasteners;
  said insulation sheet having second and third laterally spaced openings therethrough; said heat sink having fourth and fifth openings therethrough;
  said first second, and fourth openings being aligned with one another; said first fastener extending through said first and second openings and applying a compressive force only between said semiconductor device and insulation sheet to press together their engaging surfaces;
  said first fastener extending into said fourth opening but being spaced from the walls of said fourth opening and thereby being electrically insulated from said heat sink;
  said third and fifth openings being aligned with one another; and
  said second fastener extending through said third and fifth openings and applying a compressive force only between said insulation sheet and said heat sink to press together their engaging surfaces.

2. The structure of claim 1, wherein said first and second fasteners each have extended diameter heads at each end.

3. The structure of claim 1, wherein said first and second fasteners are pop rivets.

4. The structure of claim 1, wherein said semiconductor device is a TO-220 semiconductor package.

5. The structure of claim 3, wherein said semiconductor device is a TO-220 semiconductor package.

6. The structure of claim 1, wherein said insulation sheet is a thermally conductive, electrically insulative ceramic.

7. The structure of claim 2, wherein said insulation sheet is a thermally conductive, electrically insulative ceramic.

8. The structure of claim 7, wherein said first and second fasteners are pop rivets.

9. The mounting structure of claim 2, wherein said first and second metallic fasteners have shank portions of given diameters which connect their said extended diameter heads; said given diameters being less than the diameters of said second and third openings in said insulation sheet, whereby no radial stress is applied from said first and second fasteners to said insulation sheet.

10. The structure of claim 9, wherein said first and second fasteners are pop rivets.

11. The structure of claim 10, wherein said insulation sheet is a thermally conductive, electrically insulative ceramic.

12. A mounting structure for a semiconductor device comprising: a heat sink having an enlarged opening therein; a thin insulation sheet having generally parallel first and second surfaces, and first and second openings, and which is coextensive with a given area of said heat sink; and first and second conductive fastener means; said first conductive fastener means extending through said semiconductor device and said first opening in said insulation sheet and compressing only said first surface of said insulation sheet against an opposing flat conductive surface of said semiconductor device; said first conductive fastener means having a portion thereof extending beyond said second surface of said insulation sheet and into said enlarged opening in said heat sink but being spaced from the walls of said opening; said second conductive fastener means extending through said second opening in said insulation sheet and into said heat sink and compressing only said second surface into contact with said heat sink, whereby said semiconductor device is electrically insulated form said heat sink but is thermally coupled thereto through said insulation sheet.

13. The structure of claim 12, wherein said first and second fastener means each have extended diameter heads at each end.

14. The structure of claim 13, wherein said first and second fastener means are pop rivets.

15. The structure of claim 12, wherein said semiconductor device is a TO-220 semiconductor package.

16. The structure of claim 12, wherein said insulation sheet is a thermally conductive, electrically insulative ceramic.

17. The structure of claim 14, wherein said insulation sheet is a thermally conductive, electrically insulative ceramic.

18. The structure of claim 16, wherein said openings in said insulation sheet are preformed; the periphery of the portions of said fasteners which extend through said openings being spaced from the respective peripheries of said openings so that a radial stress is not applied from said fasteners to said insulation sheet.

19. A mounting structure for mounting a semiconductor device having a conductive flange having a stud projecting from the bottom thereof, comprising: a heat sink having an enlarged opening therein; a thin insulation sheet having generally parallel first and second surfaces, and first and second openings, and which is coextensive with a given area of said heat sink; and conductive fastener means; said stud extending through said first opening in said insulation sheet and compressing only said first surface of said insulation sheet against said flange of said semiconductor device; said stud having a portion thereof extending beyond said second surface of said insulation sheet and into said enlarged opening in said heat sink but being spaced from the walls of said enlarged opening; said conductive fastener means extending through said second opening in said insulation sheet and into said heat sink and compressing only said second surface into contact with said heat sink, whereby said semiconductor device is electrically insulated fom said heat sink but is thermally coupled thereto through said insulation sheet.

20. The structure of claim 22, wherein said insulation sheet is a thermally conductive, electrically insulative ceramic.

21. The structure of claim 19, wherein said openings in said insulation sheet are preformed; the periphery of the portions of said stud and conductive fastener means which extend through said openings being spaced from the respective peripheries of said openings so that a radial stress is not applied from said stud and conductive fasteners means to said insulation sheet.

* * * * *